US008004335B2

(12) United States Patent
Kim et al.

(10) Patent No.: US 8,004,335 B2
(45) Date of Patent: Aug. 23, 2011

(54) PHASE INTERPOLATOR SYSTEM AND ASSOCIATED METHODS

(75) Inventors: Kyu-hyoun Kim, Mount Kisco, NY (US); Paul W. Coteus, Yorktown Heights, NY (US); Daniel M. Dreps, Georgetown, TX (US); Frank D. Ferraiolo, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 12/028,973

(22) Filed: Feb. 11, 2008

(65) Prior Publication Data

US 2009/0201064 A1 Aug. 13, 2009

(51) Int. Cl.
*H03H 11/16* (2006.01)

(52) U.S. Cl. ........................................ 327/231; 327/355

(58) Field of Classification Search ........................ None
See application file for complete search history.

(56) References Cited

U.S. PATENT DOCUMENTS

| | | | | |
|---|---|---|---|---|
| 5,250,914 | A | 10/1993 | Kondo | |
| 5,381,367 | A | 1/1995 | Kajimoto | |
| 5,565,817 | A | 10/1996 | Lakshmikumar | |
| 5,592,126 | A | 1/1997 | Boudewijns et al. | |
| 5,920,518 | A | 7/1999 | Harrison et al. | |
| 6,075,419 | A | 6/2000 | Sun et al. | |
| 6,100,768 | A | 8/2000 | Hirayama | |
| 6,137,369 | A | 10/2000 | Kermani | |
| 6,304,113 | B1 * | 10/2001 | Dautriche | |
| 6,329,882 | B1 * | 12/2001 | Fayneh et al. | |
| 6,380,783 | B1 * | 4/2002 | Chao et al. | 327/258 |
| 6,456,165 | B1 * | 9/2002 | Kelkar | |
| 6,466,098 | B2 | 10/2002 | Pickering | 331/25 |
| 6,504,438 | B1 * | 1/2003 | Chang et al. | |
| 6,570,420 | B1 * | 5/2003 | Trivedi et al. | |
| 6,570,423 | B1 * | 5/2003 | Trivedi et al. | |
| 6,611,161 | B1 * | 8/2003 | Kumar et al. | |
| 6,617,936 | B2 * | 9/2003 | Dally et al. | |
| 6,768,356 | B1 * | 7/2004 | Wu et al. | |
| 7,149,269 | B2 | 12/2006 | Cranford, Jr. et al. | 375/373 |
| 7,151,398 | B2 | 12/2006 | Giguere et al. | 327/291 |
| 7,162,002 | B2 | 1/2007 | Chen et al. | 375/376 |
| 7,184,509 | B2 * | 2/2007 | Cho et al. | |
| 7,245,638 | B2 * | 7/2007 | Agazzi et al. | 370/516 |
| 7,298,195 | B2 * | 11/2007 | Freyman et al. | 327/247 |
| 7,409,021 | B2 * | 8/2008 | Glenn | 375/354 |
| 7,515,504 | B2 * | 4/2009 | D'Luna et al. | 365/233.1 |
| 7,580,491 | B2 * | 8/2009 | Kim et al. | 375/354 |
| 2003/0016762 | A1 | 1/2003 | Martin et al. | |
| 2003/0022694 | A1 | 1/2003 | Olsen et al. | |
| 2004/0032300 | A1 | 2/2004 | Joordens et al. | |
| 2004/0066873 | A1 | 4/2004 | Cho et al. | |
| 2004/0095195 | A1 | 5/2004 | Park et al. | |

(Continued)

FOREIGN PATENT DOCUMENTS

DE 4312086 1/1994

(Continued)

*Primary Examiner* — Cassandra Cox
(74) *Attorney, Agent, or Firm* — William A. Kinnaman, Jr.

(57) ABSTRACT

A phase interpolator system is disclosed that may include a clock to provide a clock signal, and a control section in communication with the clock to regulate the strength of the clock signal. The system may also include a generator circuit to produce an alternate clock signal based upon the strength of the clock signal received from the control section.

16 Claims, 16 Drawing Sheets

U.S. PATENT DOCUMENTS

| | | | |
|---|---|---|---|
| 2005/0140417 | A1 | 6/2005 | Patel et al. |
| 2006/0076997 | A1 | 4/2006 | Ogasawara |
| 2006/0156049 | A1 | 7/2006 | Helio |
| 2007/0090867 | A1 | 4/2007 | Kim |

FOREIGN PATENT DOCUMENTS

| | | |
|---|---|---|
| DE | 69805628 | 1/2003 |
| DE | 10336300 | 4/2004 |

* cited by examiner

| MUX_SEL_A/B | In0 | In90 | In180 | In270 | ALPHA | P0 | P90 | P180 | P270 |
|---|---|---|---|---|---|---|---|---|---|
| 0/1 | 0 | 180 | 180 | 0 | 0 | 0 | 90 | 180 | 270 |
| | 0 | 180 | 180 | 0 | 0.1 | 9 | 99 | 189 | 279 |
| | 0 | 180 | 180 | 0 | 0.5 | 45 | 135 | 225 | 315 |
| | 0 | 180 | 180 | 0 | 0.9 | 81 | 171 | 261 | 351 |
| | 0 | 180 | 180 | 0 | 1 | 90 | 180 | 270 | 0 |
| 1/1 | 180 | 180 | 0 | 0 | 1 | 90 | 180 | 270 | 0 |
| | 180 | 180 | 0 | 0 | 0.9 | 99 | 189 | 279 | 9 |
| | 180 | 180 | 0 | 0 | 0.5 | 135 | 225 | 315 | 45 |
| | 180 | 180 | 0 | 0 | 0.1 | 171 | 261 | 351 | 81 |
| | 180 | 180 | 0 | 0 | 0 | 180 | 270 | 0 | 90 |
| 1/0 | 180 | 0 | 0 | 180 | 0 | 180 | 270 | 0 | 90 |
| | 180 | 0 | 0 | 180 | 0.1 | 189 | 279 | 9 | 99 |
| | 180 | 0 | 0 | 180 | 0.5 | 225 | 315 | 45 | 135 |
| | 180 | 0 | 0 | 180 | 0.9 | 261 | 351 | 81 | 171 |
| | 180 | 0 | 0 | 180 | 1 | 270 | 0 | 90 | 180 |
| 0/0 | 0 | 0 | 180 | 180 | 1 | 270 | 0 | 90 | 180 |
| | 0 | 0 | 180 | 180 | 0.9 | 279 | 9 | 99 | 189 |
| | 0 | 0 | 180 | 180 | 0.5 | 315 | 45 | 135 | 225 |
| | 0 | 0 | 180 | 180 | 0.1 | 351 | 81 | 171 | 261 |
| | 0 | 0 | 180 | 180 | 0 | 0 | 90 | 180 | 270 |

```
ALPHA-UP=
[{(MUX_SEL_A<XOR>MUX_SEL_B) && PHASE-UP}||
 {(MUX_SEL_A<XNOR>MUX_SEL_B) && PHASE-DOWN} ] && (ALL-1 != 1)

ALPHA-DN=
[{(MUX_SEL_A<XNOR>MUX_SEL_B) && PHASE-UP}||
 {(MUX_SEL_A<XOR>MUX_SEL_B) && PHASE-UP} ] && (ALL-0 != 1)

TOGGLE-A=
[{(MUX_SEL_A<XOR>MUX_SEL_B) && PHASE-UP}||
 {(MUX_SEL_A<XNOR>MUX_SEL_B) && PHASE-DOWN} ] && (ALL-1 !==1)

TOGGLE-B=
[{(MUX_SEL_A<XNOR>MUX_SEL_B) && PHASE-DOWN}||
 {(MUX_SEL_A<XOR>MUX_SEL_B) && PHASE-UP} ] && (ALL-0 !==1)
```

FIG.12

| MODE | ALPHA | IN0 | IN1 | IN2 | IN3 | IN4 | IN5 | IN6 | IN7 | PHASE |
|---|---|---|---|---|---|---|---|---|---|---|
| 0~45 | 0 | 270 | 0 | 0 | 90 | 90 | 180 | 180 | 270 | 0 |
| | 1 | 270 | 0 | 0 | 90 | 90 | 180 | 180 | 270 | 45 |
| 45~90 | 1 | 0 | 0 | 90 | 90 | 180 | 180 | 270 | 270 | 45 |
| | 0 | 0 | 0 | 90 | 90 | 180 | 180 | 270 | 270 | 90 |
| 90~135 | 0 | 0 | 90 | 90 | 180 | 180 | 270 | 270 | 0 | 90 |
| | 1 | 0 | 90 | 90 | 180 | 180 | 270 | 270 | 0 | 135 |
| 135~180 | 1 | 90 | 90 | 180 | 180 | 270 | 270 | 0 | 0 | 135 |
| | 0 | 90 | 90 | 180 | 180 | 270 | 270 | 0 | 0 | 180 |
| 180~225 | 0 | 90 | 180 | 180 | 270 | 270 | 0 | 0 | 90 | 180 |
| | 1 | 90 | 180 | 180 | 270 | 270 | 0 | 0 | 90 | 225 |
| 225~270 | 1 | 180 | 180 | 270 | 270 | 0 | 0 | 90 | 90 | 225 |
| | 0 | 180 | 180 | 270 | 270 | 0 | 0 | 90 | 90 | 270 |
| 270~315 | 0 | 180 | 270 | 270 | 0 | 0 | 90 | 90 | 180 | 270 |
| | 1 | 180 | 270 | 270 | 0 | 0 | 90 | 90 | 180 | 315 |
| 315~360 | 1 | 270 | 270 | 0 | 0 | 90 | 90 | 180 | 108 | 315 |
| | 0 | 270 | 270 | 0 | 0 | 90 | 90 | 180 | 180 | 360(=0) |

FIG.15

| MODE | ALPHA | IN0 | IN1 | IN2 | IN3 | IN4 | IN5 | IN6 | IN7 | PHASE |
|---|---|---|---|---|---|---|---|---|---|---|
| 0~45 | 0 | 180 | 0 | 0 | 0 | 0 | 180 | 180 | 180 | 0 |
| | 1 | 180 | 0 | 0 | 0 | 0 | 180 | 180 | 180 | 45 |
| 45~90 | 1 | 0 | 0 | 0 | 0 | 180 | 180 | 180 | 180 | 45 |
| | 0 | 0 | 0 | 0 | 0 | 180 | 180 | 180 | 180 | 90 |
| 90~135 | 0 | 0 | 0 | 0 | 180 | 180 | 180 | 180 | 0 | 90 |
| | 1 | 0 | 0 | 0 | 180 | 180 | 180 | 180 | 0 | 135 |
| 135~180 | 1 | 0 | 0 | 180 | 180 | 180 | 180 | 0 | 0 | 135 |
| | 0 | 0 | 0 | 180 | 180 | 180 | 180 | 0 | 0 | 180 |
| 180~225 | 0 | 0 | 180 | 180 | 180 | 180 | 0 | 0 | 0 | 180 |
| | 1 | 0 | 180 | 180 | 180 | 180 | 0 | 0 | 0 | 225 |
| 225~270 | 1 | 180 | 180 | 180 | 180 | 0 | 0 | 0 | 0 | 225 |
| | 0 | 180 | 180 | 180 | 180 | 0 | 0 | 0 | 0 | 270 |
| 270~315 | 0 | 180 | 180 | 180 | 0 | 0 | 0 | 0 | 0 | 270 |
| | 1 | 180 | 180 | 180 | 0 | 0 | 0 | 0 | 0 | 315 |
| 315~360 | 1 | 180 | 180 | 0 | 0 | 0 | 0 | 0 | 0 | 315 |
| | 0 | 180 | 180 | 0 | 0 | 0 | 0 | 0 | 0 | 360(=0) |

FIG.18

PHASE INTERPOLATOR SYSTEM AND ASSOCIATED METHODS

RELATED APPLICATION

This application contains subject matter related to a application filed Jun. 22, 2006 entitled "Clock Generation Circuit and Method of Generating Clock Signals" and having application Ser. No. 11/472,322, the entire subject matter of which is incorporated herein by reference in its entirety. The aforementioned application is assigned to the same assignee as this application, International Business Machines Corporation of Armonk, N.Y.

FIELD OF THE INVENTION

The invention relates generally to the field of computer systems, and in particular to the area of phase interpolators used for such.

BACKGROUND OF THE INVENTION

A phase interpolator is used to generate on its output fine phase steps or increments between two input signals (A and B). Typically the input signals A and B are cyclic, e.g. they are oscillator or clock(s).

The phase interpolator outputs a clock signal whose phase is in small increments between the inputs A and B as well as being bounded between them. Control signals are used to program the incremental phase of the outputs.

The phase interpolator's output is initially (minimum input control setting of all zeros) proportional to the A input signal. As the control signal is incremented, the output phase of the phase rotator is shifted from proportionally to the A input only, towards proportionally to the B input.

As the control input is changed to still larger values, the phase rotator output continues to shift the phase of the output and will eventually reach a point where it is solely proportional to the B input only. In this fashion the phase rotator output produces small increments in phase proportional and between its inputs A & B. The function is well known and used in many applications, such as in data communications between computer chips.

SUMMARY OF THE INVENTION

In view of the foregoing background, it is therefore an object of the invention to provide improved performance of a phase interpolator and/or reduced power consumption of the phase interpolator.

This and other objects, features, and advantages in accordance with the invention are provided by a phase interpolator system that may include an input clock to provide a clock signal with a phase offset. The clock may provide clock signals having only one phase.

The system may also include a control section in communication with the clock to regulate the strength of the clock signal. The system may further include a generator circuit to produce an alternate clock signal based upon the strength of the clock signal received from the control section.

The control section may include a passive circuit element and/or an active circuit element. The passive circuit element may include a variable resistor, a variable capacitor, and/or a variable inductor, or such.

The active circuit element may include a variable buffer, a variable inverter, and/or a multiplexer, or the like. The generator circuit may include a poly-phase filter, a resistor-capacitor multi-pole poly-phase filter, a quadrature oscillator, an open loop quadrature oscillator, and/or a complementary metal-oxide-semiconductor open loop quadrature oscillator, or the like.

The control section may include a weighting circuit. The weighting circuit may include a weighted inverter stage and/or a variable buffer. The control section may include a phase rotation controller.

Another aspect of the invention is a method to improve a phase interpolator system including providing a clock signal, and regulating the strength of the clock signal. The method may also include producing an alternate clock signal based upon the strength of the clock signal.

BRIEF DESCRIPTION OF THE DRAWINGS

FIG. 12 is exemplary logic for the phase rotation controller of FIG. 11.

FIG. 15 is a chart illustrating MUX switching for FIG. 14.

FIG. 18 is a chart illustrating MUX switching for FIG. 17.

DETAILED DESCRIPTION OF THE PREFERRED EMBODIMENTS

Figure 1:
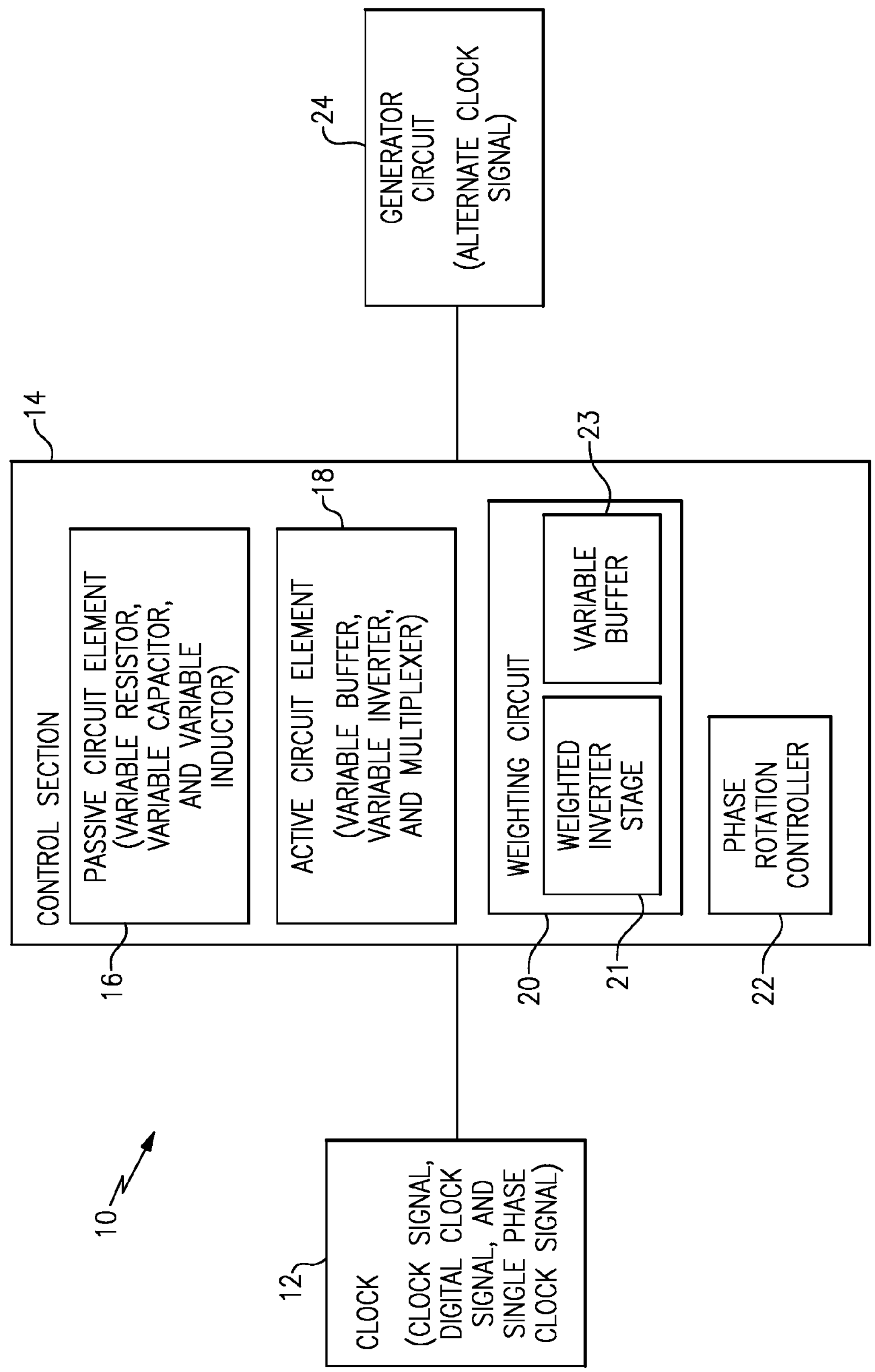
FIG. 1 is a block diagram illustrating a phase interpolator system in accordance with the invention.

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As will be appreciated by one skilled in the art, the invention may be embodied as a method, system, or computer program product. Furthermore, the invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, or a magnetic storage device.

Computer program code for carrying out operations of the invention may be written in an object oriented programming language such as Java, Smalltalk, C++ or the like. However, the computer program code for carrying out operations of the invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The invention is described below with reference to flowchart illustrations and/or block diagrams of methods, apparatus (systems) and computer program products according to exemplary embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring initially to FIG. 1, a phase interpolator system 10 is initially described. The system 10 includes a clock 12 to provide a clock signal, for example. In one embodiment, the clock 12 provides a digital clock signal as will be appreciated by those of skill in the art. In another embodiment, the clock 12 provides clock signals having only one phase.

The system 10 also includes a control section 14 in communication with the clock 12 to regulate the strength of the clock signal, for instance. In one embodiment, the control section 14 includes a passive circuit element 16 and/or an active circuit element 18. The passive circuit element 16 may include a variable resistor, a variable capacitor, and/or a variable inductor, or such. The active circuit element 18 may include a variable buffer, a variable inverter, and/or a multiplexer, or the like.

In another embodiment, the control section 14 includes a weighting circuit 20. The weighting circuit 20 includes a weighted inverter stage 21 and/or a variable buffer 23, or the like. In yet another embodiment, the control section 14 includes a phase rotation controller 22.

Figure 2:
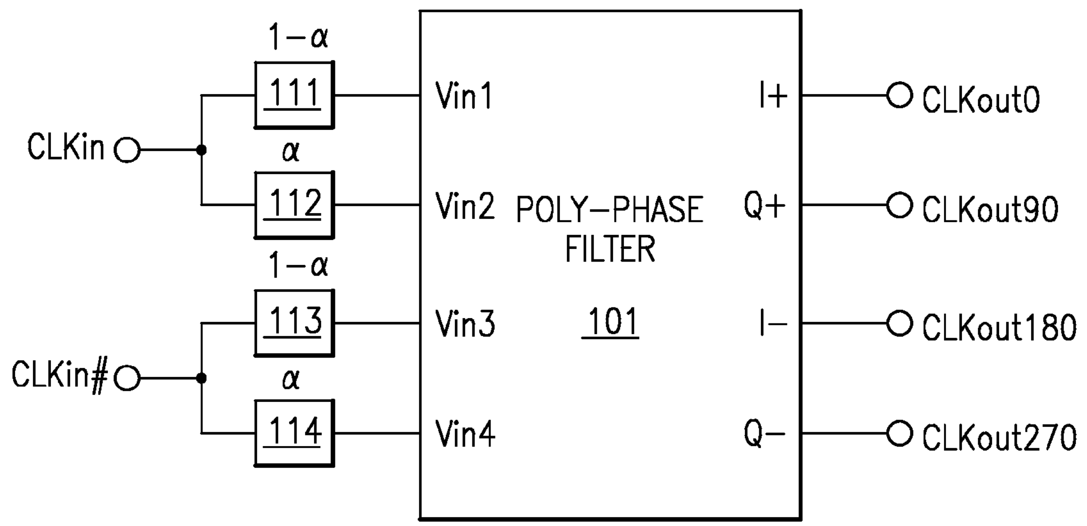
FIG. 2 is a block diagram illustrating a phase rotator using a poly-phase filter in accordance with the invention.
Figure 3:
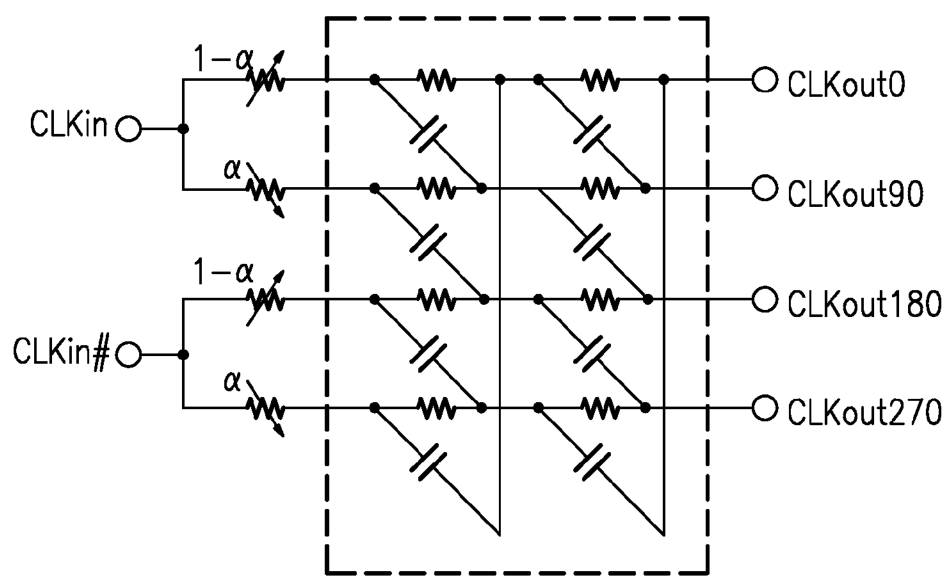
FIG. 3 is a schematic diagram illustrating a phase rotator using an RC poly-phase filter in accordance with the invention.
Figure 4:
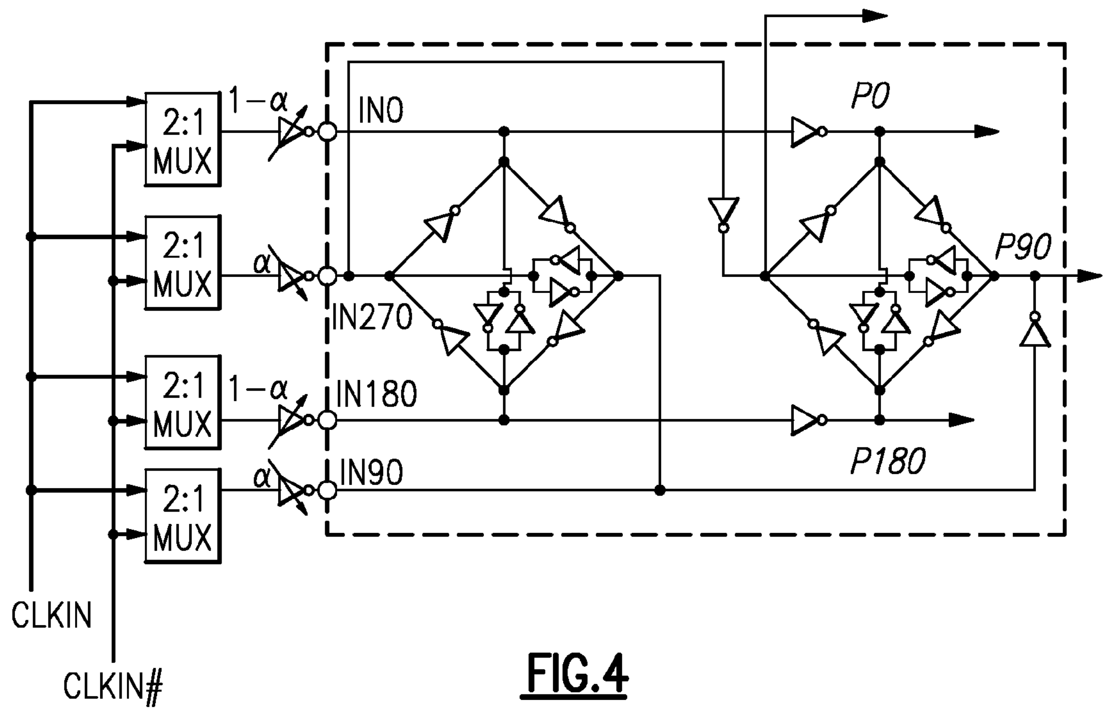
FIG. 4 is a schematic diagram illustrating a phase rotator using an inverter poly-phase filter in accordance with the invention.

With additional reference to FIGS. 2-4, the system 10 further includes a generator circuit 24 to produce an alternate clock signal based upon the strength of the clock signal received from the control section 14, for instance. In various embodiments, the generator circuit 24 includes a poly-phase filter, a resistor-capacitor multi-pole poly-phase filter, a quadrature oscillator, an open loop quadrature oscillator, and/or a complementary metal-oxide-semiconductor open loop quadrature oscillator, or the like.

Accordingly, the system 10 provides a relatively small active area, ease of control, digital nature, high level of integration, and low power dissipation. The system 10 would replace, for example in a conventional design, an analog phase-locked loop ("PLL") and separate phase rotator, or a delay-locked loop ("DLL") with a separate phase rotator.

FIG. 2 illustrates the general case of a poly-phase filter 101 with four inputs and four outputs. In this embodiment, the inputs 111-114 can be controlled and manipulated in several different ways (using a resistor, a capacitor, or an active circuit element such as a buffer or inverter) to vary the strength of each input, e.g. clock signal. The variable alpha is used to vary the strength of the input, and alpha can take on any value between 0 to 1. As the strength of each input is changed, the outputs of the poly-phase filter will be influenced or modified in phase as described in more detail below.

FIG. 3 is an example of the system 10 using a resistor-capacitor ("RC") network poly-phase filter such as a 2-pole poly(4)-phase filter. In this embodiment, the strength of the inputs is varied with a vernier made from a variable resistor, for example.

FIG. 4 is an embodiment of the system 10 using an inverter poly-phase filter. More in particular, this embodiment uses an active complementary metal-oxide-semiconductor ("CMOS") open loop quadrature ("quad") oscillator. Two quad oscillators are cascaded together to produce four clock 12 outputs which are phase shifted by 90 degrees relative to one another. Cascading of the quad oscillators provides additional phase and oscillator accuracy. The strength of the input clocks 12 are controlled with an inverter of variable strength.

Figure 5:
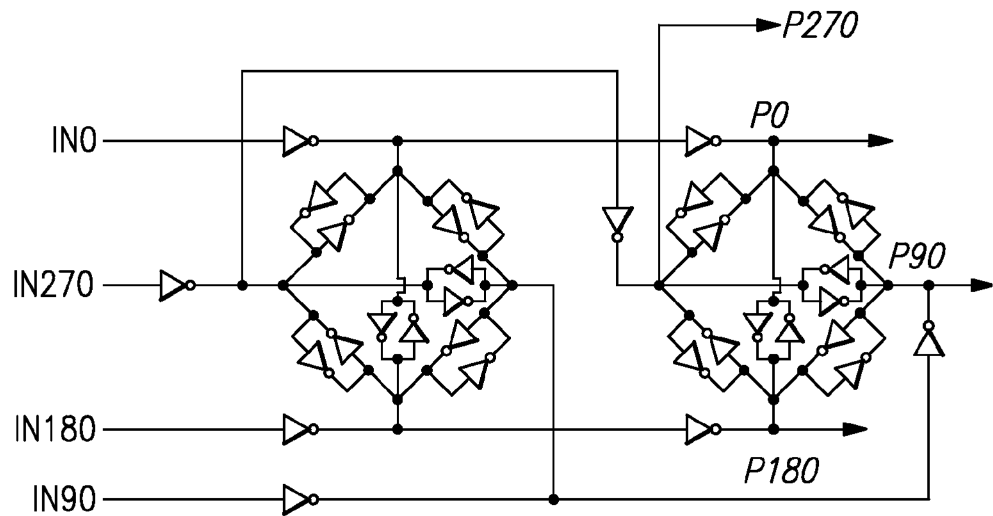
FIG. 5 is a schematic diagram illustrating an open loop quad phase oscillator in accordance with the invention.

FIG. 5 is a detail of the foregoing cascaded quad oscillators. The input clock signals and output alternate clock signals waveforms are shown in FIG. 6 for an alpha set equal to zero.

Referring to FIG. 5, four exemplary cases are presented. Case A is when inputs IN0 and IN180 are fully stimulated with complimentary clock inputs, and IN180 and IN270 are off. The resulting output clock signals on P0, P90, P180,P270 are shown on FIG. 6. Case B is when inputs IN270 and IN90 are fully stimulated with the same complimentary clock inputs as in case A, and IN0 and IN180 are off, resulting in a phase shift of the outputs P0, P90, P180 and P270 of +90 degrees from case A.

Case C is when IN180 and IN0 are stimulated with the same complimentary clock inputs as case A, IN180 and IN270 are off, the phase of the outputs with respect to case A will be shifted by +180 degrees. Case D is when IN90 and IN270 are stimulated with the same inputs clocks as in case A, IN0 and IN180 are off, the resulting phase of the outputs would be shifted by +270 degrees with respect to case A.

Figure 6:
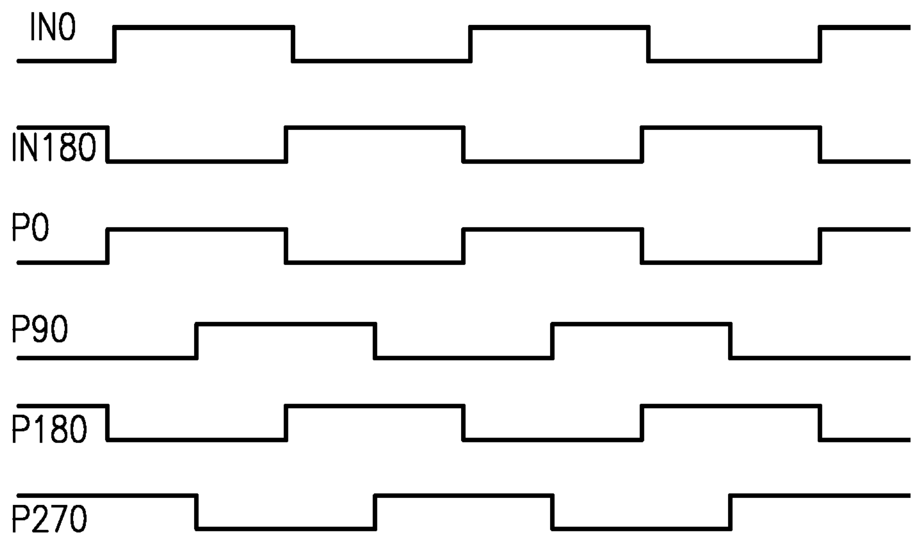
FIG. 6 is a chart illustrating inputs and outputs of the oscillator of FIG. 5.
Figure 7:
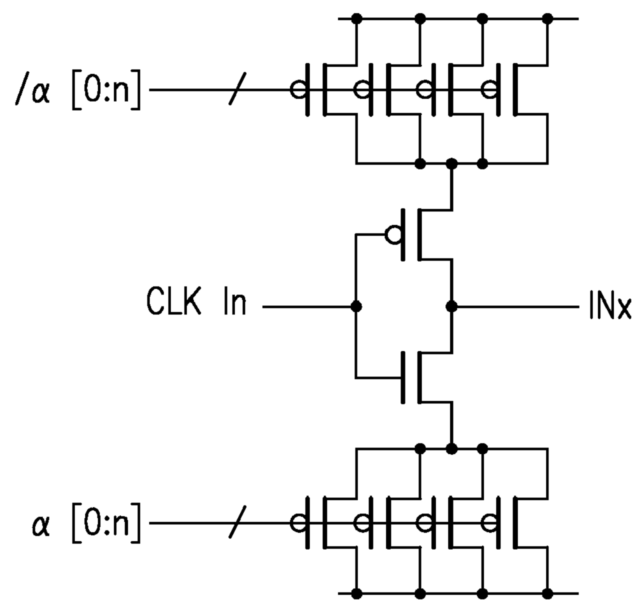
FIG. 7 is a schematic diagram illustrating a circuit for input weighting in accordance with the invention.

Referring to FIG. 6, if the all the input inverters are replaced by the circuit shown in FIG. 7, then the clock signal strength applied at the input to the quad oscillator can now be controlled and weighted. The clock 12 inputs to the quad oscillator pass through the weighted inverter stage 21(Clk In→Inx) and the control signals (alpha) are applied with digital signal levels to control the amount of the input clock signal strength which passes to the output Inx.

For example, if all the control inputs are active, all the Negative Channel Field Effect Transistor ("nFETs") on the bottom and all the Positive Channel Field Effect Transistor ("PFETs") on top of the inverter are on, and hence the inverter passes the fully weighted clock input. Similarly if none of the control signals are active, all the nFETS and pFETs are off, no current flows in the inverter and hence no signal passes to the output node INx. Intermediate values of the control inputs (alpha) will allow a weighting of the clock input signal to pass the output INx to drive the quad oscillator.

FIG. 4 is a fully configured phase rotator to allow a complete 360 phase rotation of the quad oscillator outputs. The clock inputs are applied via a 2:1 multiplexer ("mux") to allow the inputs clocks 12 to the quad to be selected and changed. The variable buffer 23 shown in FIG. 4 is the weighting circuit 20 shown in FIG. 7. It is used to control all four input nodes to the quad oscillator. P0, P90, P180 and P270 represent the output of the quad oscillator. Alpha is the control input vector in FIG. 7 (0:n) and is applied to all four signal at once.

Figure 8:
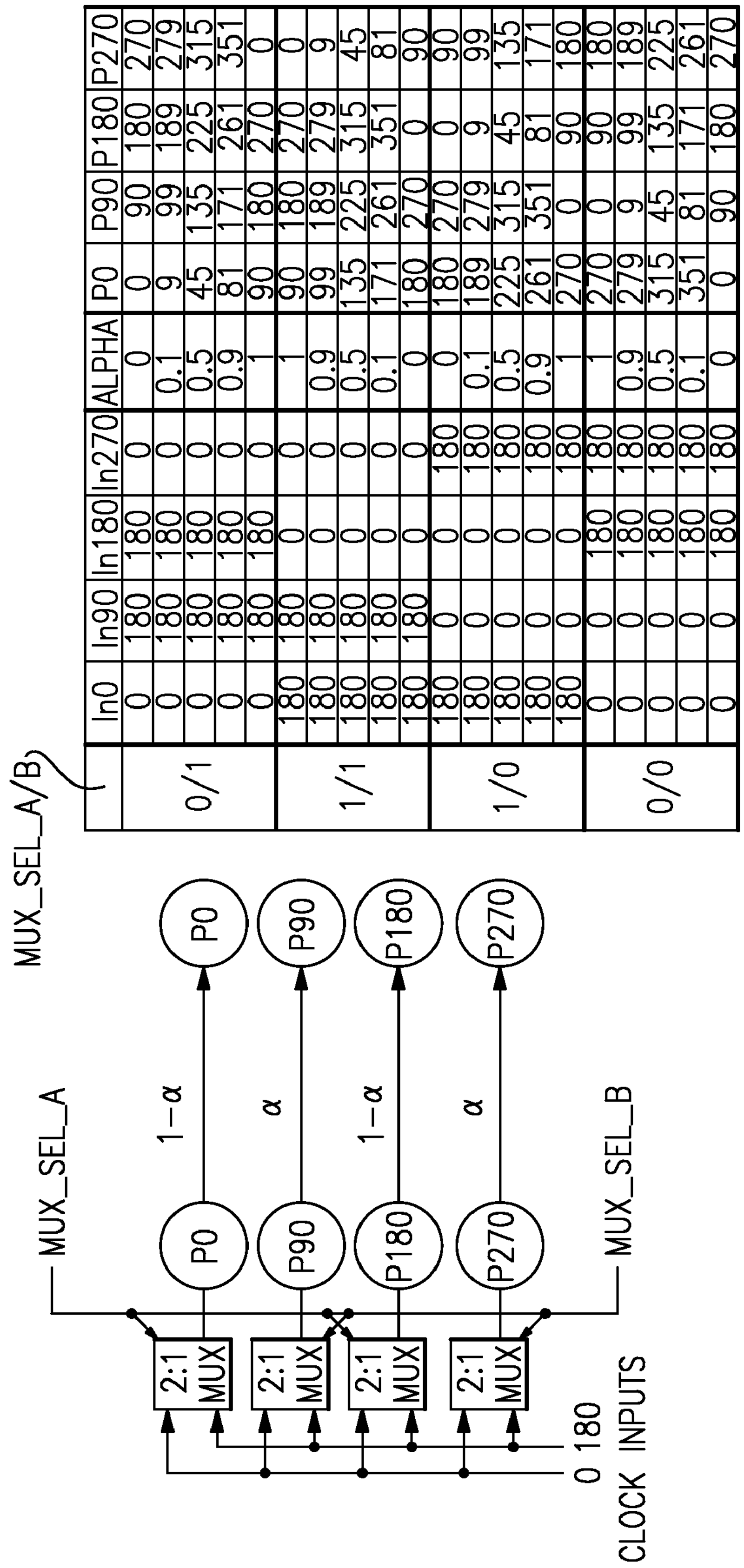
FIG. 8 is a chart illustrating outputs as a f(alpha) in accordance with the invention.

The table in FIG. 8 on the right is used to depict the values of the output as a function of alpha vector and the inputs. In other words, the quad oscillator outputs as a f(alpha). For example, Case A described above is the first row in the table with the alpha vector equal to all zeros—IN0 and IN180 have the clock and compliment clock applied respectively, no signal is propagated to the quad oscillator inputs IN90 or IN270 since alpha vector equals zero resulting in the waveforms show in FIG. 3 for P0, P90, P180 and P270.

Referring to FIG. 4 and the table in FIG. 8, and starting with case A and alpha=0, there would be no clock input signals applied to IN90 or IN270 and IN0 and IN180 are fully weighted with the clock 12 and the complimented clock. As the control input alpha is increased, the IN0 and IN180 clock inputs will slowly be weighted off and the IN90 and IN270 node will be slowly weighted on. When alpha reaches a value of 1 (fully weighted), the IN0 and IN180 signals will be fully off and the IN90 and IN270 signals with be fully on as shown in row 5 of the table.

Figure 9:
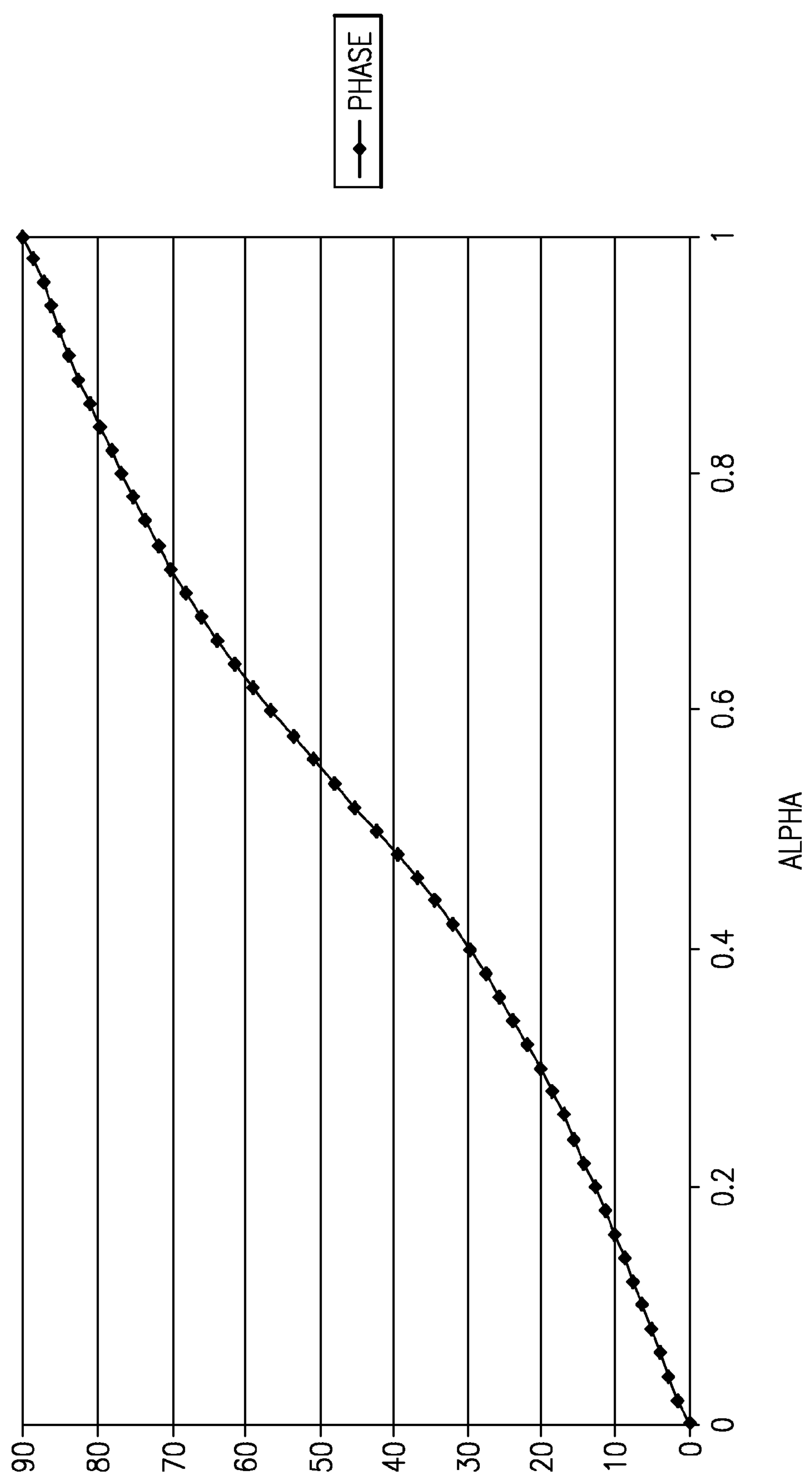
FIG. 9 is a chart illustrating P0 outputs as a f(alpha) in accordance with the invention.

The output nodes will have now gone through a full 90 degree phase change with a transfer characteristic show in FIG. 9 for the P0 output node as a f(alpha), all the other outputs will also undergo a corresponding phase change. The current condition is case B described above. Note since IN0 and IN180 are fully off, their influence on the quad rotator is zero, hence they can be removed or switched without affecting circuit operation.

At this point the IN0 and IN180 inputs are switched with opposite phases of the clock 12 as shown in row 6 of the table. Alpha is then slowly decreased from one back to zero changing the phase by an additional 90 degrees. This is case C above and row 10 in the table. Note since IN90 and IN270 are fully off, their influence on the quad rotator is zero, hence they can be removed or switched without affecting circuit operation.

Figure 10:
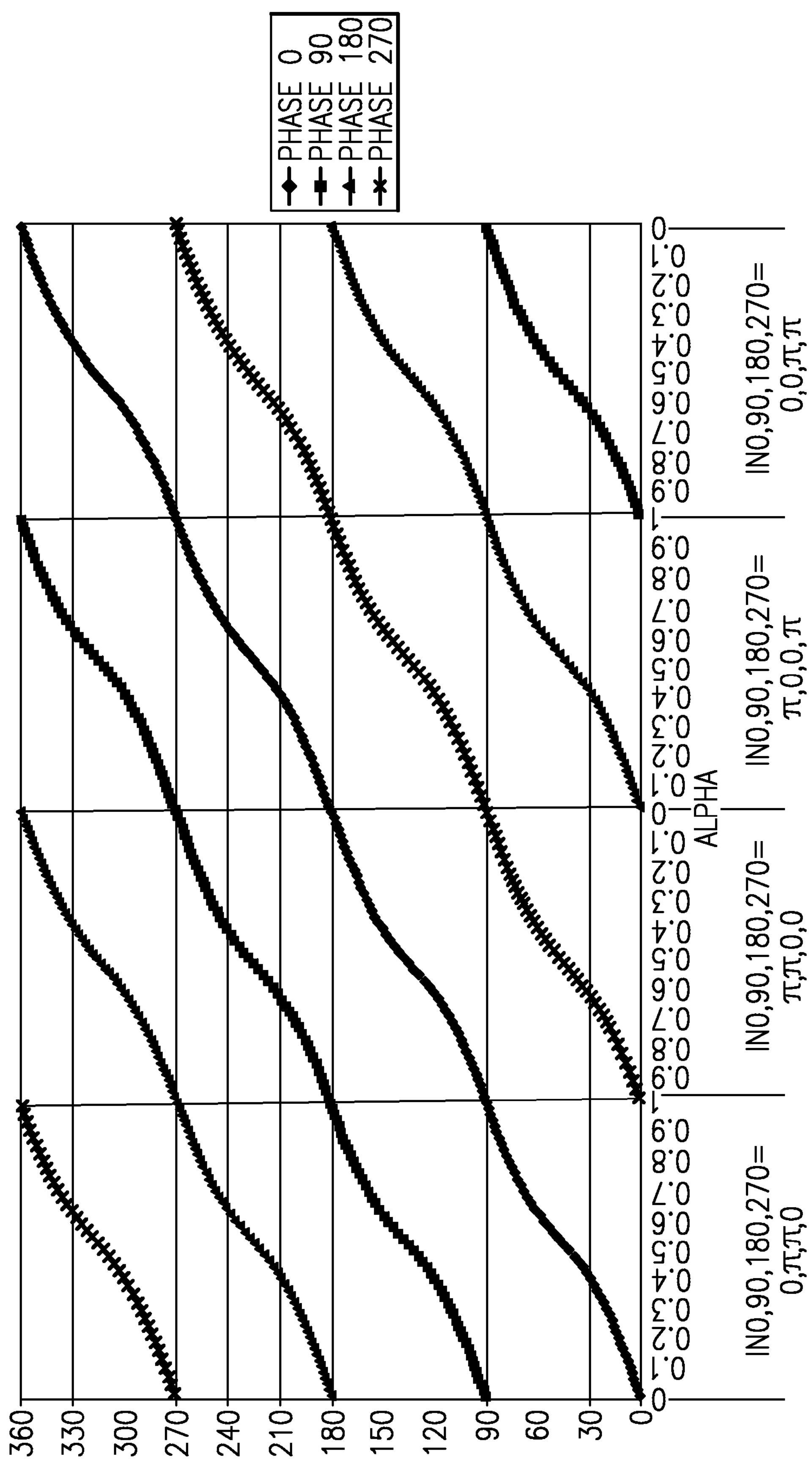
FIG. 10 is a chart illustrating P0, P90, P180, and P279 outputs as a f(alpha) in accordance with the invention.

At this point the IN90 and IN270 inputs are switched with opposite phases of the clock 12 as shown in row 11 of the table. This function continues through all 360 degree with clock input changes occurring every 90 degrees when the input signals required to be changed at completely unweighted (off). The table depicts the complete selection process for the inputs and the corresponding phase values of the outputs. FIG. 10 depicts all four outputs over the entire 360 degree range where P0, P90, P180, P270 are Outputs as a f(alpha).

Figure 11:
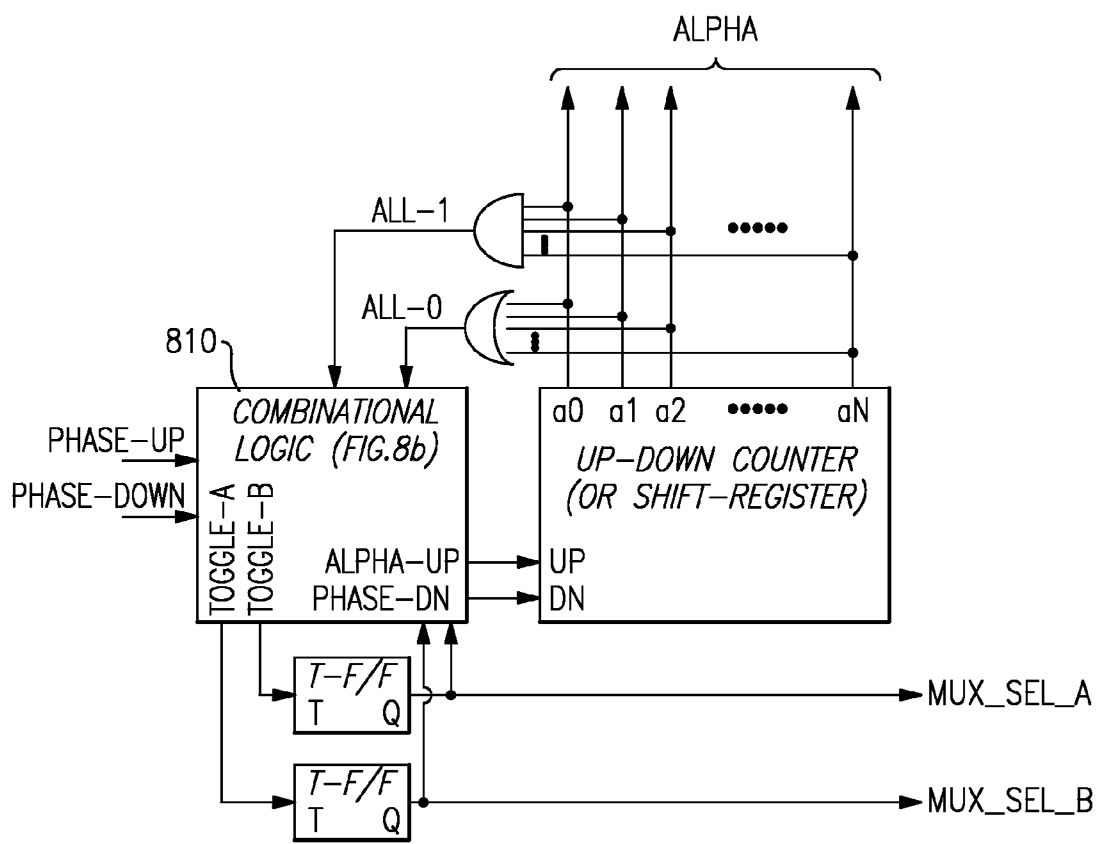
FIG. 11 is a schematic diagram illustrating a phase rotation controller in accordance with the invention.

FIG. 11 shows an example of controller implementation for alpha and MUX selection signal generation using a phase rotation controller 22. FIG. 12 shows logical operation of the combinational logic in the phase rotation controller 22 of FIG. 11, for instance.

Figure 13:
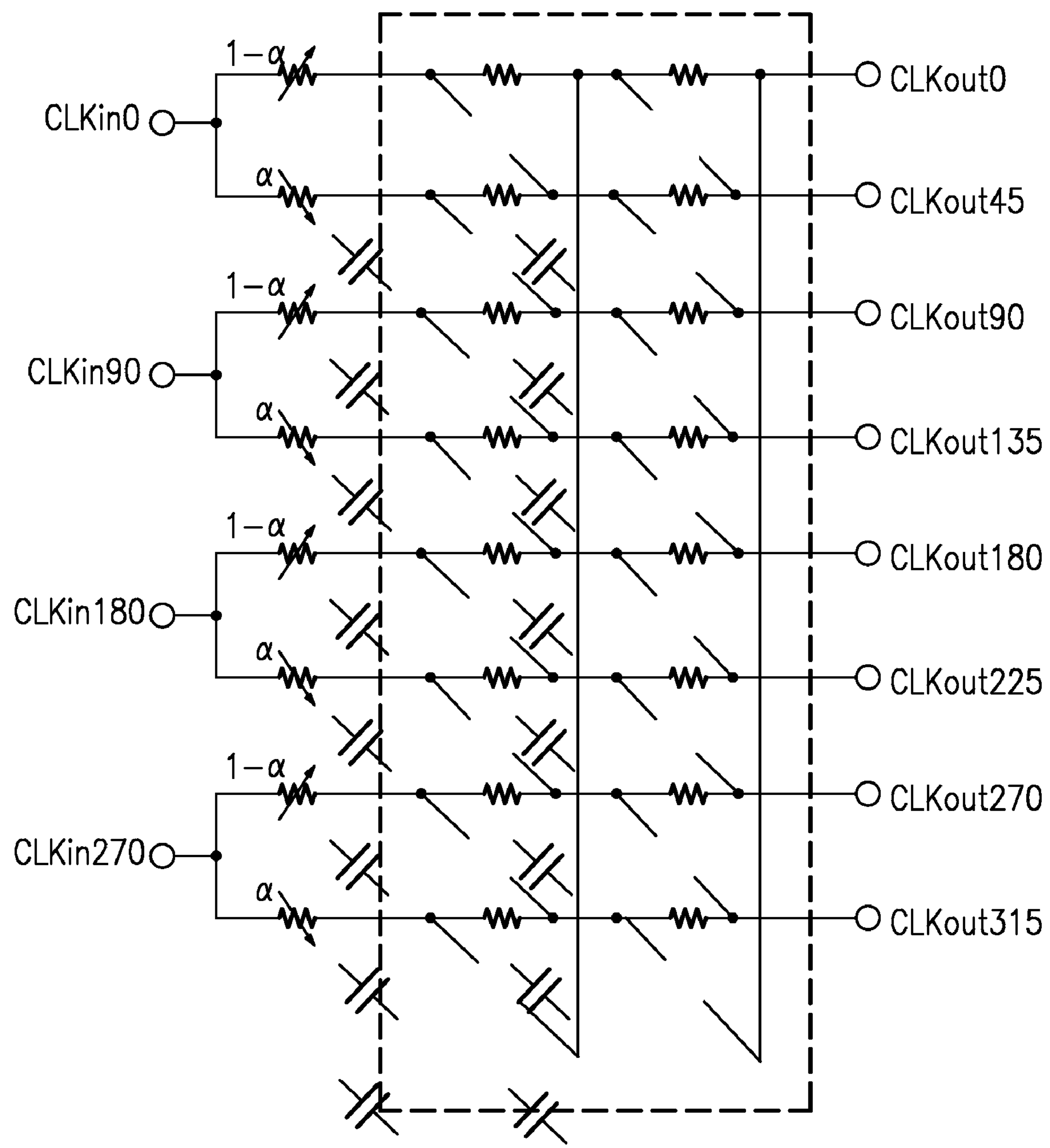
FIG. 13 is a schematic diagram illustrating a phase rotator using a 45 degree version of an RC poly(8)-phase filter having 4-phase inputs in accordance with the invention.

FIG. 13 shows an extension of system 10 into a poly-phase rotator having 8 phase outputs. It was assumed that 4 phase inputs are given to this circuit. Due to the self phase generating characteristic of a poly-phase filter, relative phases of 8 outputs in FIG. 13 are 45 degrees between adjacent ones. Therefore, by changing alpha from zero to unity, we can 45 degree shift in output phases.

Figure 14:
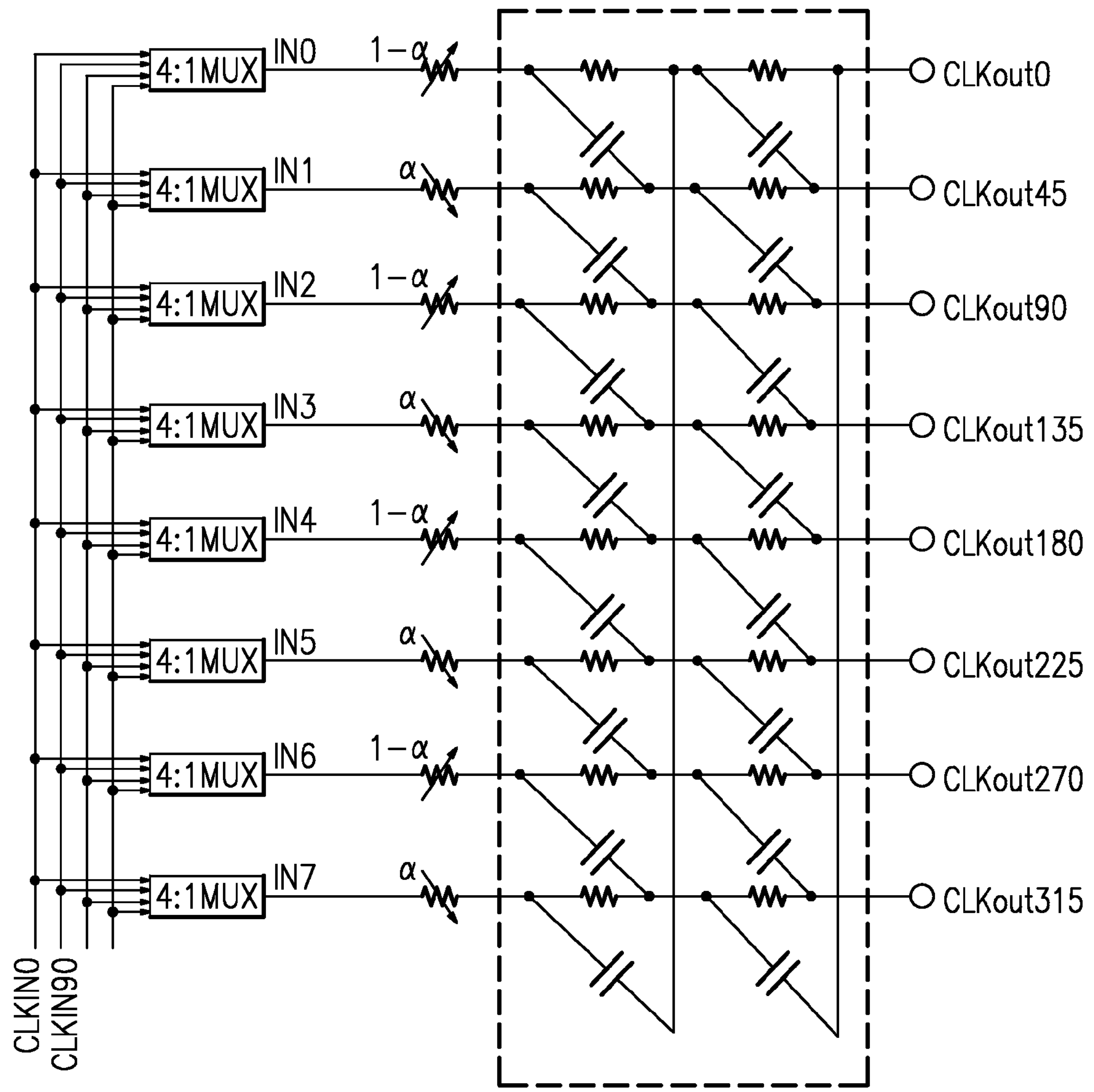
FIG. 14 is a schematic diagram illustrating a phase rotator using a 360 degree version of an RC poly(8)-phase filter having 4-phase inputs in accordance with the invention.

FIG. 14 shows a circuit having 4:1 MUX at each input of the circuit in FIG. 13. By adding these MUX, we can get 360 degree rotation as shown in FIG. 15.

Figure 16:
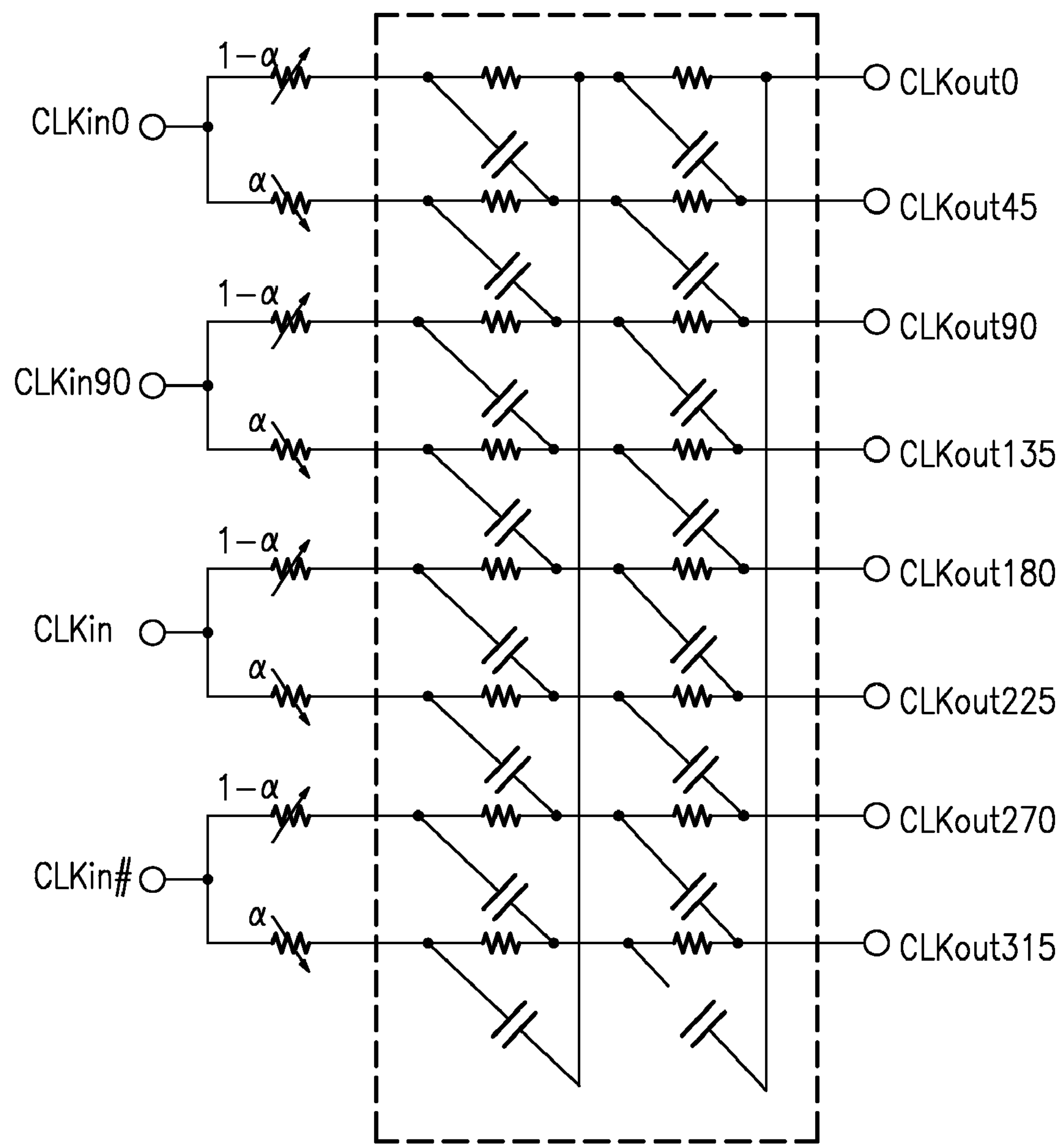
FIG. 16 is a schematic diagram illustrating a phase rotator using a 45 degree version of an RC poly(8)-phase filter having 2-phase inputs in accordance with the invention.

FIG. 16 shows another way of implementing a phase rotator having 8 phase outputs. It was assumed that differential (2 phase) inputs are given to this circuit. Due to the self phase generating characteristic of a poly-phase filter, relative phases of 8 outputs in FIG. 16 are 45 degrees between adjacent ones. Therefore, by changing alpha from zero to unity, we can 45 degree shift in output phases.

Figure 17:
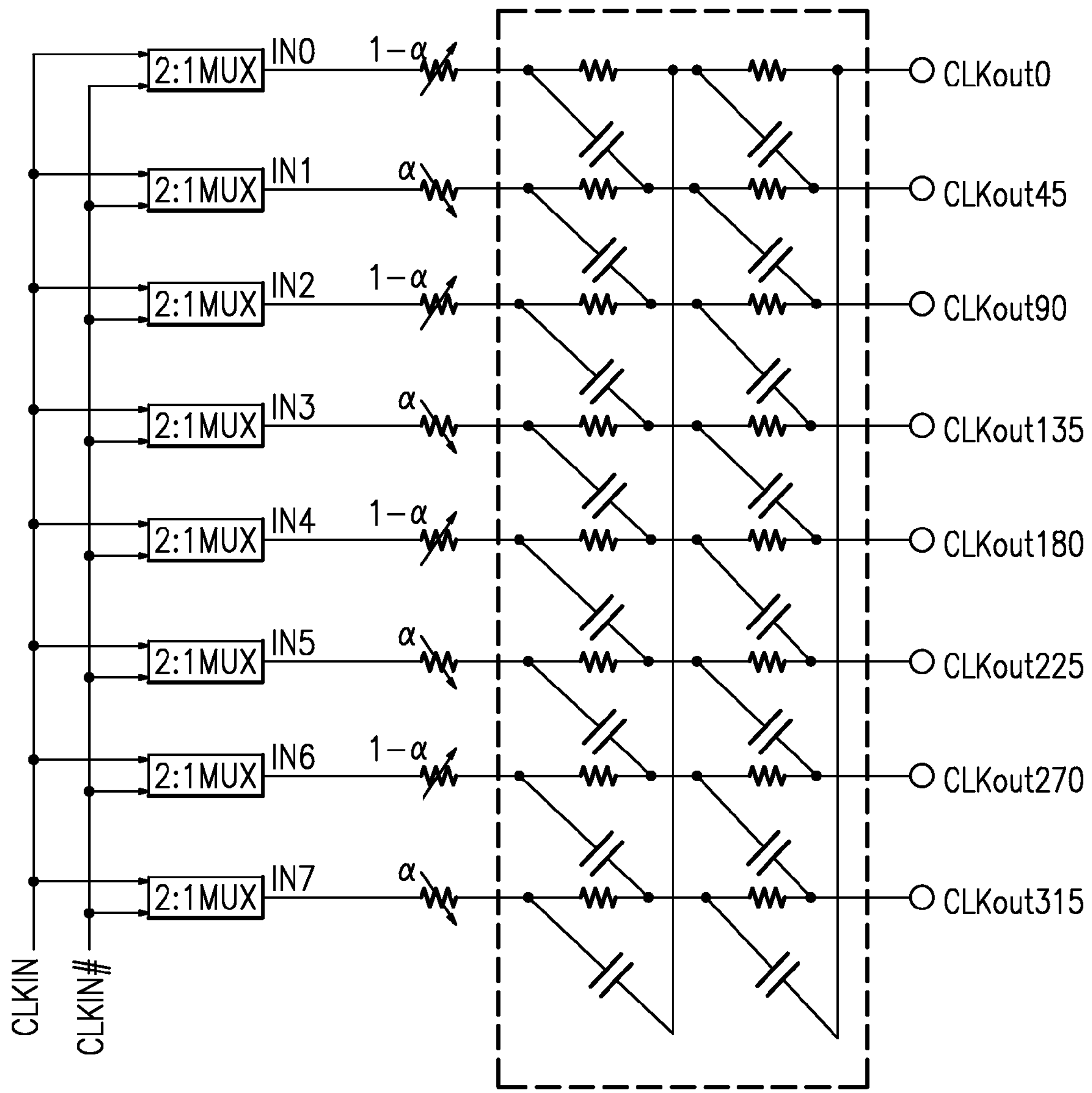
FIG. 17 is a schematic diagram illustrating a phase rotator using a 360 degree version of an RC poly(8)-phase filter having 2-phase inputs in accordance with the invention.

FIG. 17 shows a circuit having 2:1 MUX at each input of the circuit in FIG. 16. By adding these MUX, we can get 360 degree rotation as shown in FIG. 18.

Using the same methodology shown in FIG. 13 through FIG. 18, one skilled in the art would be able to implement a system 10 N-phase generating phase rotator having N/M number of input phases, where N and M are natural numbers and M is one of divisors of N.

Figure 19:
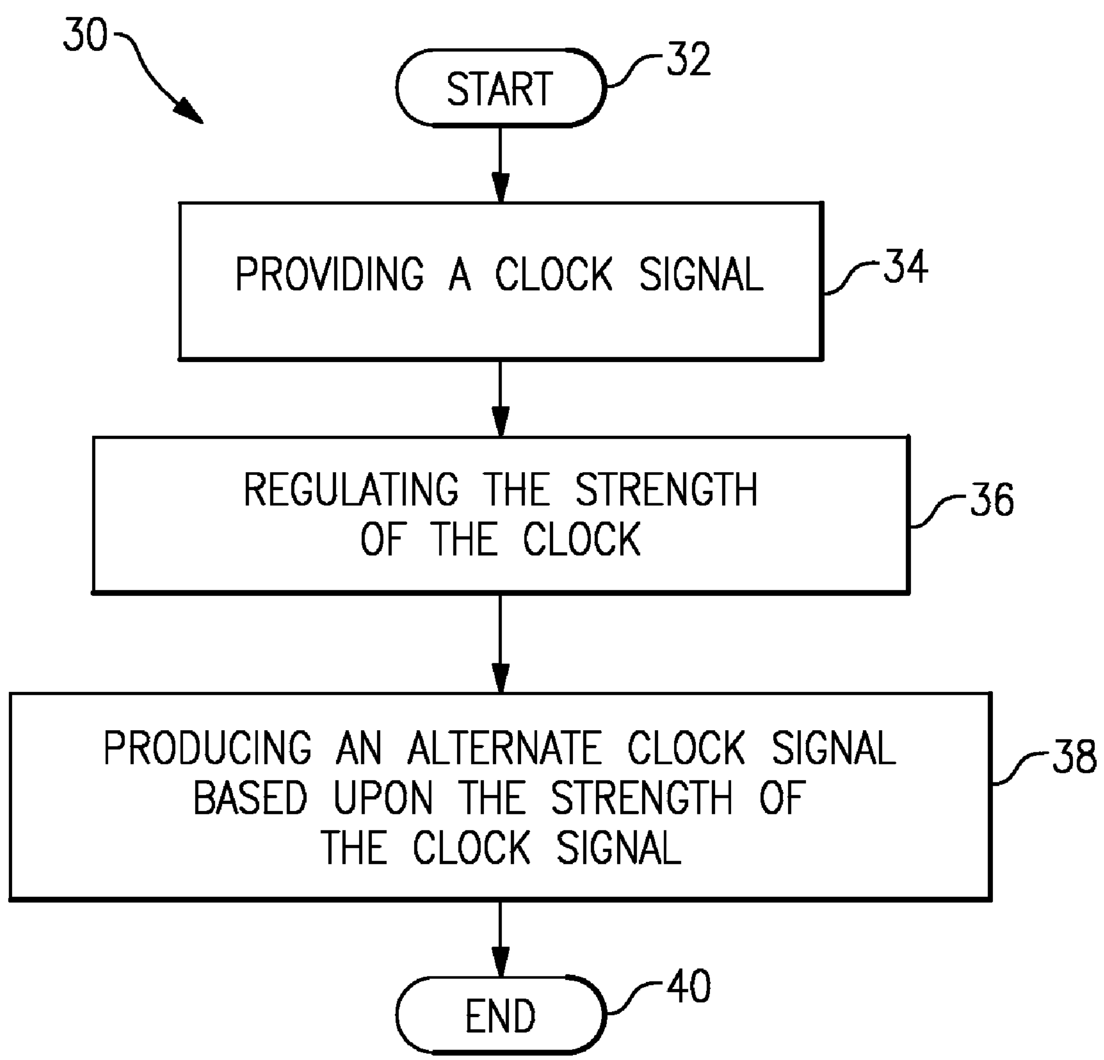
FIG. 19 is a flowchart illustrating a method to improve a phase interpolator system in accordance with the invention.

Another aspect of the invention is directed to a method to improve a phase interpolator system, which is now described with reference to flowchart 30 of FIG. 19. The method begins at Block 32 and may include providing a clock signal at Block 34, and regulating the strength of the clock signal at Block 36. The method may further include producing an alternate clock signal based upon the strength of the clock signal at Block 38. The method ends at Block 40.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A phase interpolator system comprising:

a clock to provide a clock signal;

a control section in communication with said clock to regulate the strength of the clock signal; and a generator circuit to produce an alternate clock signal based upon the strength of the clock signal received from said control section; and wherein said control section includes at least one of a passive circuit element and an active circuit element.

2. The phase interpolator system of claim 1 wherein said passive circuit element includes at least one of a variable resistor, a variable capacitor, and a variable inductor.

3. The phase interpolator system of claim 1 wherein said active circuit element includes at least one of a variable buffer, a variable inverter, and a multiplexer.

4. The phase interpolator system of claim 1 wherein said generator circuit includes at least one of a poly-phase filter, a resistor-capacitor multi-pole poly-phase filter, a quadrature oscillator, an open loop quadrature oscillator, and a complementary metal-oxide-semiconductor open loop quadrature oscillator.

5. The phase interpolator system of claim 1 wherein said control section includes a weighting circuit.

6. The phase interpolator system of claim 5 wherein said weighting circuit includes at least one of a weighted inverter stage and a variable buffer.

7. The phase interpolator system of claim 1 said control section includes a phase rotation controller.

8. The phase interpolator system of claim 1 wherein said clock provides digital clock signals.

9. The phase interpolator system of claim 1 wherein said clock provides a clock signal having one phase.

10. A method to improve a phase interpolator system comprising:

providing a clock signal;

regulating the strength of the clock signal; and producing an alternate clock signal based upon the strength of the clock signal; and wherein regulating the strength of the clock signal uses at least one of a passive circuit element and an active circuit element.

11. The method of claim 10 wherein the passive circuit element includes at least one of a variable resistor, a variable capacitor, and a variable inductor.

12. The method of claim 10 wherein the active circuit element includes at least one of a variable buffer, a variable inverter, and a multiplexer.

13. The method of claim 10 wherein producing the alternate clock signal uses at least one of a poly-phase filter, a resistor-capacitor multi-pole poly-phase filter, a quadrature oscillator, an open loop quadrature oscillator, and a complementary metal-oxide-semiconductor open loop quadrature oscillator.

14. The method of claim 10 wherein regulating the strength of the clock signal is performed by a weighting circuit.

15. The method of claim 14 wherein the weighting circuit includes at least one of a weighted inverter stage and a variable buffer.

16. The method of claim 10 wherein the clock provides at least one of digital clock signals and a single phase clock signal.

* * * * *